United States Patent
Duerig et al.

(10) Patent No.: US 8,592,955 B2
(45) Date of Patent: Nov. 26, 2013

(54) ACCURATE DEPOSITION OF NANO-OBJECTS ON A SURFACE

(75) Inventors: Urs T Duerig, Zurich (CH); Felix Holzner, Zurich (CH); Cyrill Kuemin, Freienbach (CH); Armin W. Knoll, Adliswil (CH); Philip Paul, Zurich (CH); Heiko Wolf, Pfaeffikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/606,326

(22) Filed: Sep. 7, 2012

(65) Prior Publication Data
US 2013/0009287 A1    Jan. 10, 2013

Related U.S. Application Data

(63) Continuation of application No. 13/456,596, filed on Apr. 26, 2012.

(30) Foreign Application Priority Data

Apr. 29, 2011 (EP) .................................... 11164336

(51) Int. Cl.
| | |
|---|---|
| *H01L 23/58* | (2006.01) |
| *H01L 29/06* | (2006.01) |
| *H01L 23/48* | (2006.01) |
| *H01L 23/52* | (2006.01) |
| *H01L 29/40* | (2006.01) |
| *H01L 23/544* | (2006.01) |

(52) U.S. Cl.
USPC ........... 257/635; 257/622; 257/626; 257/784; 257/797

(58) Field of Classification Search
None
See application file for complete search history.

(56) References Cited

U.S. PATENT DOCUMENTS

| 6,548,313 B1* | 4/2003 | Ravi et al. ........................... 438/6 |
| 6,730,972 B2* | 5/2004 | Ravi et al. ...................... 257/379 |
| 2004/0016928 A1* | 1/2004 | Ravi et al. ........................ 257/77 |

OTHER PUBLICATIONS

Li, M. et al., "Bottom-up Assembly of Large-area Nanowire Resonator Arrays". Nature Nanotechnol. 3, 88 (2008).
Kraus, T. et al., "Nanoparticle Printing with Single-particle Resolution". Nature Nanotechnol. 2, 570 (2007).
Hung, A. M. et al., "Large-area Spatially Ordered Arrays of Gold Nanoparticles Directed by Lithographically Confined DNA Origami", Nature Nanotechnol. 5, 121 (2010).
Freer, E. M. et al., "High-yield Self-limiting Single-nanowire Assembly with Dielectrophoresis", Nature Nanotechnol. 5, 525 (2010).
Spatz, J. P. et al., "A Combined Top-down/bottom-up Approach to the Microscopic Localization of Metallic Nanodots", Adv. Materials 14: 24, 1827 (2002).

* cited by examiner

*Primary Examiner* — Hoang-Quan Ho
(74) *Attorney, Agent, or Firm* — Scully, Scott, Murphy & Presser, P.C.; Gail H. Zarick, Esq.

(57) ABSTRACT

The invention notably concerns a method for depositing nano-objects on a surface. The method includes: providing a substrate with surface patterns on one face thereof; providing a transfer layer on said face of the substrate; functionalizing areas on a surface of the transfer layer parallel to said face of the substrate, at locations defined with respect to said surface patterns, such as to exhibit enhanced binding interactions with nano-objects; depositing nano-objects and letting them get captured at the functionalized areas; and thinning down the transfer layer by energetic stimulation to decompose the polymer into evaporating units, until the nano-objects reach the surface of the substrate. The invention also provides a semiconductor device which includes a substrate and nano-objects accurately disposed on the substrate.

13 Claims, 6 Drawing Sheets

ACCURATE DEPOSITION OF NANO-OBJECTS ON A SURFACE

CROSS-REFERENCE TO RELATED APPLICATION

This application is a continuation of and claims priority from U.S. patent application Ser. No. 13/456,596, filed Apr. 26, 2012, which in turn claims priority under 35 U.S.C. §119 from European Patent Application No. 11164336.7 filed Apr. 29, 2011, the entire contents of which are incorporated herein by reference.

BACKGROUND OF THE INVENTION

1. Field of the Invention

The invention relates to the field of controlled positioning of particles of nanoscale size, i.e., nano-objects, on surfaces.

2. Description of Related Art

Directed and precise positioning of nanoparticles is a well known problem. Typically the particles are randomly dispersed in a solution and immobilized on a template surface providing specific interactions with the particles (e.g. electrostatic and dielectric forces, steric and surface chemical interactions). Yet, the helping structures for assembly are often poorly compatible with the aimed functionality. A potential solution is to transfer the particles from a templating surface to a target functional substrate. However, one challenge is to precisely align the particles with existing structures on the target substrate, which is a key to the functionality of the whole assembly. For example, using soft printing stamps, alignment is limited by the metrological placement of the stamp and distortions of the stamp.

SUMMARY OF THE INVENTION

One aspect of the present invention provides a method for depositing nano-objects on a surface. The method includes: depositing the nano-objects at functionalized areas on a surface of a transfer layer including a polymer decomposable into evaporating units, wherein the transfer layer is on a substrate with surface patterns; and thinning down the transfer layer by energetic stimulation to decompose the polymer into the evaporating units until the nano-objects reach the surface of the substrate. The method is carried out by providing a substrate with surface patterns on one face thereof; providing a transfer layer which includes a polymer decomposable into evaporating units on the face of the substrate; functionalizing areas on a surface of the transfer layer parallel to the face of the substrate, at locations defined with respect to the surface patterns, to exhibit enhanced binding interactions with nano-objects; depositing the nano-objects and letting them get captured at the functionalized areas; and thinning down the transfer layer by energetic stimulation to decompose the polymer into the evaporating units until the nano-objects reach the surface of the substrate.

Another aspect of the present invention provides a semiconductor device including: a substrate; nano-objects disposed on the substrate, wherein the average main dimension of the nano-objects is between 10 nm and 100 nm, where at least a substantial portion of the nano-objects are nano-rods, and wherein the substrate is a silicon wafer covered with amorphous carbon layer which is covered with $SiO_2$.

Methods and products embodying the present invention will now be described, by way of non-limiting examples, and in reference to the accompanying drawings.

BRIEF DESCRIPTION OF THE DRAWINGS

The invention and its preferred embodiments, additional objects, features and advantages will be better understood by referring to the detailed description of the exemplary embodiments when read in conjunction with the attached drawings, in which.

DETAILED DESCRIPTION OF THE PREFERRED EMBODIMENTS

Figure 1:
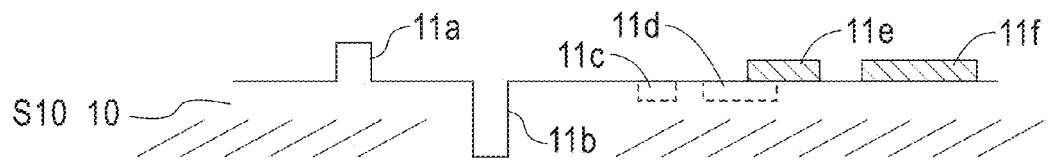
FIG. 1 illustrates a target substrate according to an embodiment of the present invention.

As an introduction to the following description, general aspects of embodiments of methods according to the present invention are discussed. First, a substrate is provided which has surface patterns on one face thereof. Then, a transfer layer is applied on the substrate, which layer includes a polymer decomposable into evaporating units. Next, specific areas at the surface of the transfer layer are functionalized, parallel to the substrate, at locations defined with respect to the surface patterns. The functionalized areas shall exhibit enhanced binding interactions with the nano-objects. Nano-objects can then be deposited on the surface; they get captured at the functionalized areas. Finally, the transfer layer is thinned down, using an appropriate energetic stimulation, which results in decomposing the polymer into evaporating units. For example, the transfer layer can be thermally activated. Alternatively, a chemical stimulus can serve this purpose. The process is stopped when the nano-objects reach the surface of the substrate.

In embodiments, the method can include one or more of the following features: the polymer includes polymer chains able to unzip upon energetic stimulation, the polymer chains having a molecular weight preferably less than 50 kDa, and more preferably able to decompose into units having molecular weights less than 200 Da on average; the energetic stimulation includes heating the transfer layer, preferably between 130° C. and 170° C.; the polymer includes polyaldehydes and/or phenolic molecular glasses, and preferably includes a poly(phthalaldehyde) polymer; the surface patterns includes one or more amongst the following: a void, a contact pad, an on-chip wiring, and an alignment mark for assisting a determination of the locations at the step of functionalizing; a thickness of the transfer layer is between 5 nm and 200 nm, preferably between 50 nm and 90 nm; at least some of the areas are functionalized such as to favor preferred orientations for the nano-objects, when the latter get captured at the functionalized areas; at least some of the areas are functionalized using at least one of the following techniques: local ionization at the location; local charge deposition; locally enhancement of hydrogen bonding strength, for example, via NH or OH groups; locally tailoring hydrophobicity of the surface of the transfer layer; or geometrically texturing the surface of the transfer layer; depositing includes depositing the nano-objects using a liquid phase self-assembly technique; at the step of depositing, the nano-objects are immersed in a liquid, and are enabled to deposit by applying the liquid to the surface of the transfer layer; enabling particles to deposit includes: applying the liquid to the surface of the transfer layer of by maintaining a layer of the liquid against the surface with a lid, whereby a meniscus of the liquid is defined between the surface and one edge of the lid; and moving the lid or the surface, the liquid being preferably a solvent, the nano-objects being more preferably encapsulated in a surfactant coating to prevent coagulation in the solvent; at the step of depositing, the average main dimension of the nano-objects is between 10 nm and 100 nm, and preferably between 25 and 75 nm; at the step of depositing, at least a substantial portion of the nano-objects used are nano-rods; and the substrate is a Si wafer, preferably covered with amorphous carbon layer, the carbon layer being more preferably covered with $SiO_2$.

It is proposed to combine a top-down micro-fabrication and bottom-up assembly of nano-objects which self organize on a volatile transfer layer. One advantage of using the additional transfer layer is to allow the assembly process to be calibrated or tuned essentially independently from the underlying substrate. Accordingly, the transfer layer can be suitably chosen to have the right properties for the assembly step (for example, contact angle and hydrophobicity). Therefore, the quality of the assembly shall work essentially similarly on the transfer layer, independently from the substrate underneath. Then the transfer layer is removed and the particles are transferred onto the arbitrary substrate. For example, a sacrificial template is used for the placement and transfer of the nano-objects, such as nanoparticles. The template material is deposited directly on top of the functional target surface and is patterned subsequently with guiding structures which act as traps for an aligned and precise positioning of particles relative to the functional surface. The registry to the underlying target surface is aided by the detection of characteristic features on the target surface. After immobilization of the particles on the template surface, the template material is homogeneously transferred into the gas phase. Thereby the particles are transferred to the target substrate in a way where the lateral position of the particles is preserved.

Typically, an unzip polymer is relied upon. As the unzipping effect is self-sustained, depolymerization is facilitated. Furthermore, polymeric chains can be made of arbitrary length which offers substantial flexibility in tuning the material properties.

More details shall be given now, in reference to the figures. As disclosed above, a core idea here is the use of a volatile transfer layer which is functionalized at the surface in order to bind objects with nanometer dimensions at predefined locations and with predefined orientations. After assembly of the nano-objects, the transfer layer is decomposed into molecular units which spontaneously escape from the surface via evaporation. Thereby the transfer layer is thinned down and the assembled nano-objects approach the target surface. After complete evaporation of the transfer layer, the nano-objects are deposited on the target surface precisely at the projected positions defined by the functionalized pattern on the transfer layer surface.

The target substrate 10 is provided in step S10, FIG. 1. The substrate 10 can for instance be a Si chip that underwent various processing steps in the course of the device fabrication. After these pre-processing steps, the substrate obtained includes surface patterns 11a-11f on one face thereof. It can for example contain voids 11b, doped contact pads 11c-11d, on chip wiring 11e-11f, and alignment marks 11a for assisting the registry of the functionalization for the next step of self assembly of nano-objects.

Figure 2:
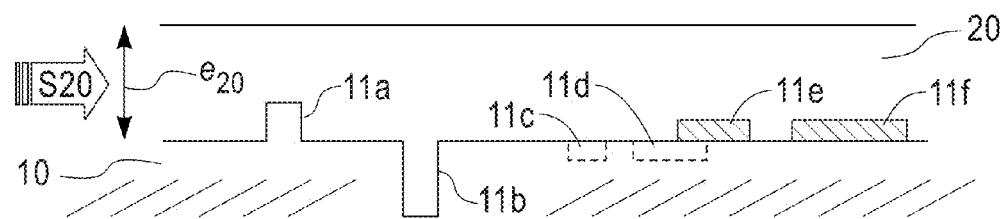
FIG. 2 illustrates a transfer layer deposited onto a target by means of spin coating or evaporation according to an embodiment of the present invention.

In FIG. 2, step S20, the transfer layer 20 is deposited onto the target (i.e., on the face of the substrate which exhibits the above patterns), typically by means of spin coating or evaporation. Such techniques are known per se. In principle at least, the thickness $e_{20}$ of the target layer is not critical. It can for instance be anywhere between 5 nm and 200 nm. Yet, preferred thicknesses are located between 50 nm and 90 nm, which in general is satisfactory in terms of deposition process, accuracy of positioning of the nano-objects, evaporation characteristics, and the like.

The transfer layer, however, must be decomposable into units which are able to escape from the surface by evaporation. Low molecular weights are therefore preferred. For example, the polymer chains have a molecular weight preferably less than 50 kDa, and are able to decompose into units having molecular weights less than 200 Da on average. Phenolic molecular glass and phthaladehyde polymers are for instance well suited for this purpose. This shall be discussed in more details later.

Figure 3:
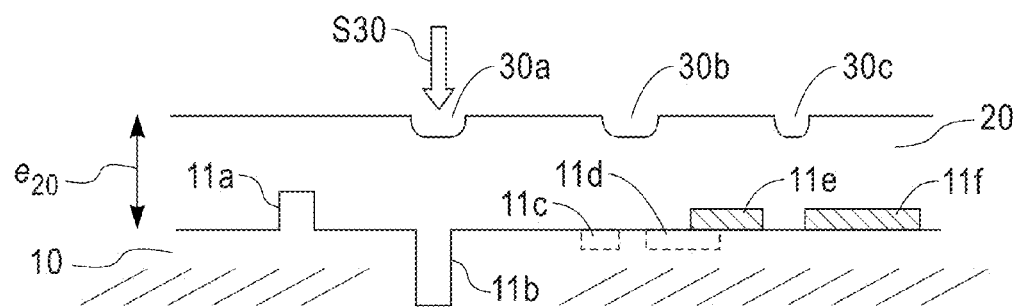
FIG. 3 illustrates an upper surface of a transfer layer being functionalized to enable the directed assembly of the nano-objects according to an embodiment of the present invention.

In FIG. 3, step S30, the upper surface of the transfer layer 20 is functionalized to enable the directed assembly of the nano-objects. More precisely, areas 30a-30c are functionalized on the surface of the transfer layer parallel to the face of the substrate, at locations defined with respect to the surface patterns, such as to exhibit enhanced binding interactions with nano-objects.

Functionalization of the areas 30a-c can be achieved by local ionization or charge deposition, by locally enhancing the hydrogen bonding strength, i.e. via NH or OH groups, by tailoring the hydrophobicity of the surface, or by geometrically texturing the surface (simple asperities are formed), thereby providing more surface contact area and constraining the degrees of freedom for particle motion.

Figure 4A:
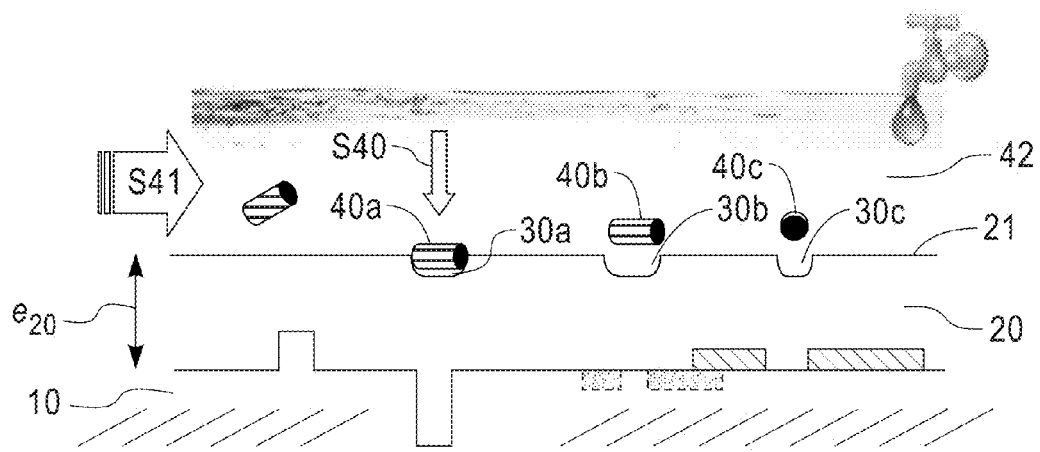
FIG. 4A illustrates nano-objects deposited on the surface and captured at the functionalized areas according to an embodiment of the present invention.
Figure 4B:
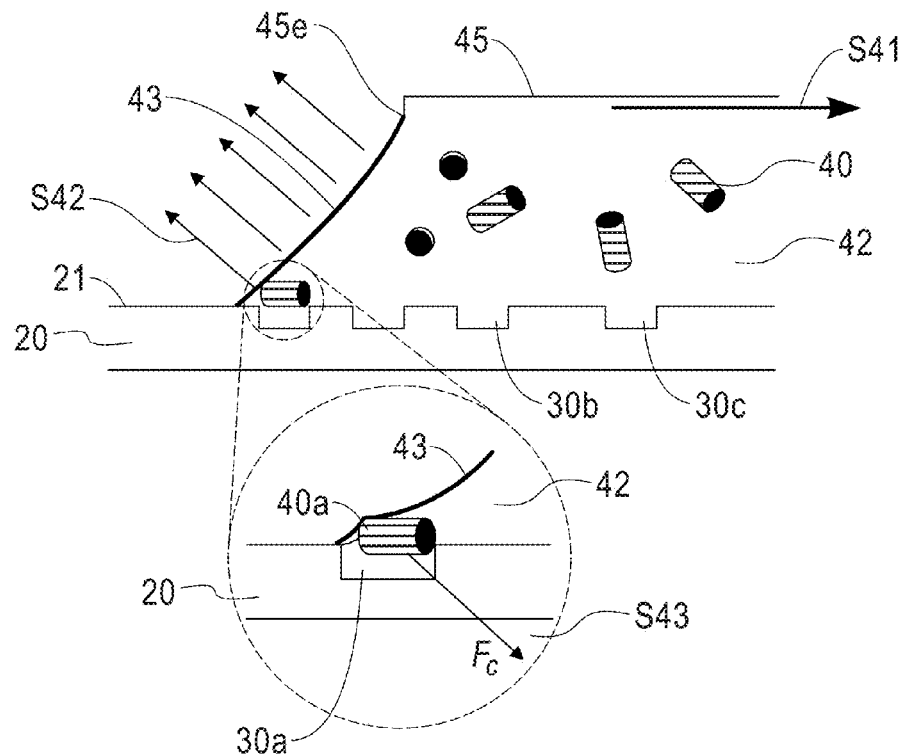
FIG. 4B illustrates liquid film containing the nano-objects pulled across the surface according to an embodiment of the present invention.

Preferably, at least some of the areas are functionalized such as to favor preferred orientations for the nano-objects, as to be seen in FIGS. 4A-B, when the objects get captured at said areas. Thus, specific orientation and position with respect to the target 10 are provided for the areas.

Alignment of the functionalization is e.g., aided by alignment marks 11a which can be detected optically. Alternatively, alignment marks can produce topographic features at the surface of the transfer layer, which can be detected using local probe imaging techniques, as known per se.

Next, as depicted in FIG. 4A, step S40, nano-objects 40a-40c are deposited, e.g., randomly, on the surface and get captured at the functionalized areas 30a-30c.

Preferably, the nano-objects are deposited using liquid phase self assembly techniques. For example, the nano-objects 40a-c are immersed in a solvent 42, typically water. A thin liquid film containing the nano-objects can for instance be pulled across the surface, as depicted in FIG. 4B. There, particles interact with the exposed surface of the transfer layer 20 and get trapped at the functionalized areas. The assembly yield at the functionalized areas depends on particle concentration and exposure time (the fill factor obtained shall depend on the density of functionalized sites and the assembly yield). Less practical variants can include mechanically dispensing, e.g., sputtering particles to the surface asperities.

Particles can be provided as a colloidal suspension in the liquid 42. Thus, particles are easily enabled to deposit on the surface by applying the liquid thereto. If needed, a low concentration of particles and low exposure time can be used to ensure a random filling at the functionalized areas. Increasing the concentrations and exposure time increases the assembly yield.

In embodiments, the particles and the liquid solvent 42 are chosen such that particles are subject to capillary forces at the surface 21, during the deposition, as depicted in FIG. 4B. Accordingly, trapping the particles 40 at the functionalized areas 30a, 30b and 30c (e.g., simple asperities) can be partly assisted by capillary forces. One way to achieve a capillarity-assisted deposition process is to apply the liquid 42 to the surface 21 of the transfer layer 20 by maintaining a layer 42 of the liquid against the surface with a lid 45 on top and to pull the lid, step S41. A meniscus 43 will accordingly form between the surface 21 of the transfer layer and an edge of 45e of the lid 45. The meniscus 43 is an air-liquid interface at which liquid likely evaporates (step S42) at a rate determined by the geometry and thermodynamic conditions of the experiment, causing in turn the meniscus 43 to retract. This meniscus further exerts pressure on particles close to the interface upon retracting, see e.g., Malaquin et al., Langmuir 2007, 23, 11513. This results in a force $F_c$ on particles, with a downward, vertical component, thereby causing the particles to get trapped at asperities, as illustrated for particle 40a and asperity 30a in FIG. 4B. If needed, the process can be assisted by heating the liquid. In other variants, particles get trapped by way of their momentum, without specifically assisting the deposition process, as to be exemplified later.

Figure 5:
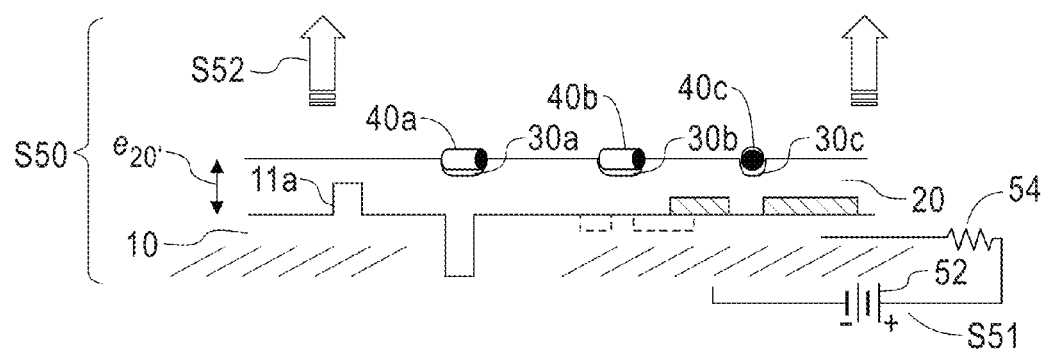
FIG. 5 illustrates transfer layer thinned down by means of evaporation according to an embodiment of the present invention.

The transfer layer 20 is thinned down by means of evaporation, as depicted in FIG. 5, step S50. The thickness $e_{20}$, accordingly decreases. Better results are achieved if the transfer layer includes material (e.g., organic) which can be easily decomposed into low molecular weight and, preferably, chemically inert fragments. Surface evaporation ensures that the assembled nano-objects remain in registry with respect to the substrate and only move perpendicular to the target plane as the transfer layer is thinned down. Molecular glass materials and phthalaldehyde polymer films are suited candidates, which can be evaporated in step S52 by raising the temperature to, for example, approximately 150° C.; and in step S51, using any appropriate heating means 52, 54 connected to the layer 20, for example, via the substrate 10. In variants, light pulses can be used.

Figure 6:
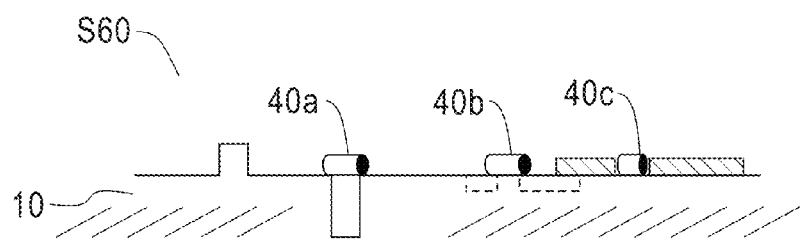
FIG. 6 illustrates nano-objects deposited directly on the surface of the substrate at the desired positions according to an embodiment of the present invention.

At the end of the evaporation process, the nano-objects are deposited directly on the surface of the substrate 10, at the desired positions, as depicted in FIG. 6, step S60. The process steps of FIGS. 2-5 can be repeated in order to form more complex assemblies. Furthermore, standard wafer scale microfabrication processes can be used on the assembled structures as required for the desired device function.

The nano-objects can be of any material and shape. Typical dimensions are in the range of 10 nm to ~1 µm. Preferably yet, the average main dimension of the nano-objects is between 10 nm and 100 nm, and more preferably between 25 and 75 nm, which present methods can advantageously afford.

In embodiments, the particles are furthermore preferably encapsulated in a surfactant coating to prevent coagulation in the solvent solution. A surfactant is a surface-active molecule. At low concentrations, surfactant molecules likely reside at the air-water interface, where they reduce the surface tension. Reaching the CMC (critical micelle concentration), they additionally start forming micelles. A surfactant molecule usually has a hydrophilic headgroup and a hydrophobic tailgroup (a long alkyl chain). The hydrophilic headgroup can be cationic, anionic, or non-ionic. Whether an ionic (and which charge) or a non-ionic surfactant is to be used or not can depend on the colloidal system. Surfactants should preferably be selected not to cause agglomeration and precipitation of the colloidal particles. Sometimes mixtures of surfactants are advantageous. Useful concentrations are mostly in the mM range but can vary significantly. Using surfactants, the contact angle can be tuned towards smaller values, such that the meniscus projection onto the surface is as large as possible, and that a corresponding force has a vertical, downwardly directed component, as illustrated in FIG. 4B. The relative dimensions of particles 40a-c and asperities 30a-c, the concentration of particles in the liquid 42, the nature of particles 40 and liquid 42 can be adjusted depending on the desired application, e.g., by trial and error. Following this principle, the entire surface 21 can be patterned by moving the lid 45 (step S41, FIG. 4B) or the surface 21 according to the evaporation rate of the liquid at the level of the meniscus 43. The transfer layer is next reduced, as shown in FIG. 5, until particles reach the desired positions, as shown in FIG. 6.

By way of example, the above scheme is demonstrated using Au nano-rods as objects and a phthalaldehyde polymer film as transfer layer. The cylindrically shaped nano-rods have a diameter of 25±5 nm and a length of 75±10 nm. They are encapsulated in a cetyltrimethylammoniumbromid (CTAB) surfactant coating to prevent coagulation in the solvent solution. The phthalaldehyde polymer has a molecular weight of 36 kDa. For spin coating a 3% solution in THF is used.

A 70 nm thick transfer film was be deposited on a target substrate including of a Si wafer, which was covered with a 100 nm amorphous carbon and 5 nm of $SiO_2$ film.

Figure 7:
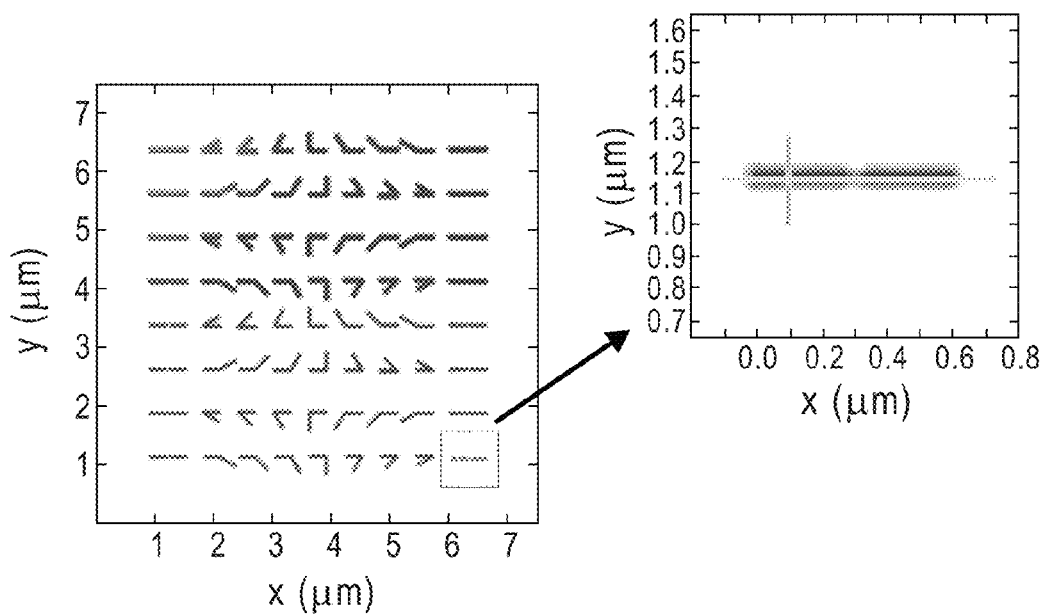
FIG. 7 illustrates target surface functionalization achieved by means of V-groove patterns according to an embodiment of the present invention.

In FIG. 7 the target surface functionalization was achieved by means of V-groove patterns, which were thermomechanically written into the surface of a 70 nm thick phthalaldehyde transfer layer. The width of the grooves matches the diameter of the nano-rods. The depth of the grooves varies between 20 and 60 nm depending on the parameters chosen for writing the patterns. The pixel size is 15 nm. An image of the topographical data is shown, using the grayscale as height information. A darker color encodes lower lying areas, i.e. the grooves. The image is displayed with accentuated contrasts, for the ease of visualization.

Figure 8:
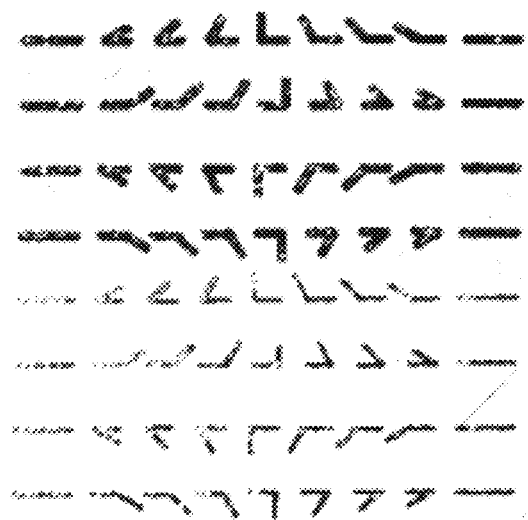
FIG. 8 illustrates an atomic force microscopy (AFM) image of the transfer layer after the nano-rod assembly according to an embodiment of the present invention.

A droplet of nano-rod suspension was deposited on the patterned surface and let dry (without requiring additional means like the lid of FIG. 4B). As the meniscus of the evaporating droplet sweeps over the patterned surface, nano-rods are captured and trapped in the grooves and the rods preferentially point along the groove axis, as depicted in FIG. 8. FIG. 8 is an atomic force microscopy (AFM) image of the transfer layer after the nano-rod assembly. Again, a topographical image is shown, with accentuated contrasts.

Figure 9:
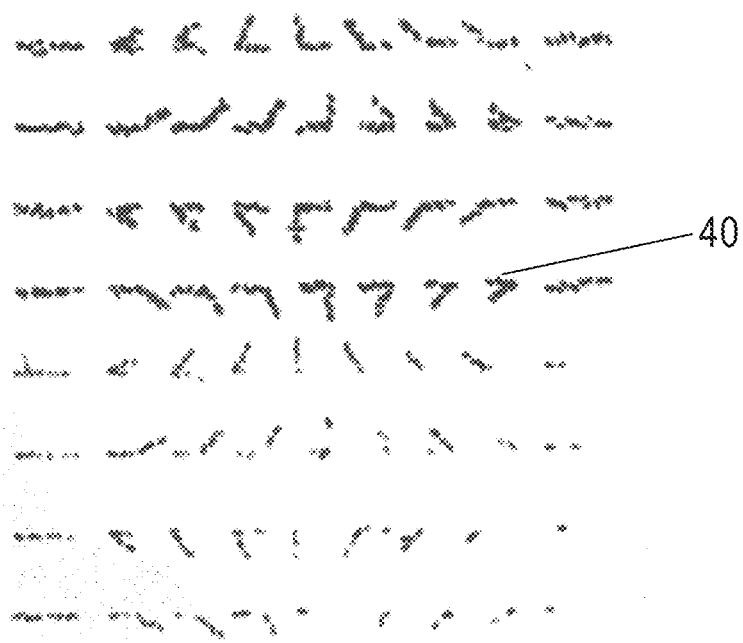
FIG. 9 illustrates a negative of a SEM micrograph of the nano-rod assembly according to an embodiment of the present invention.
Figure 10:
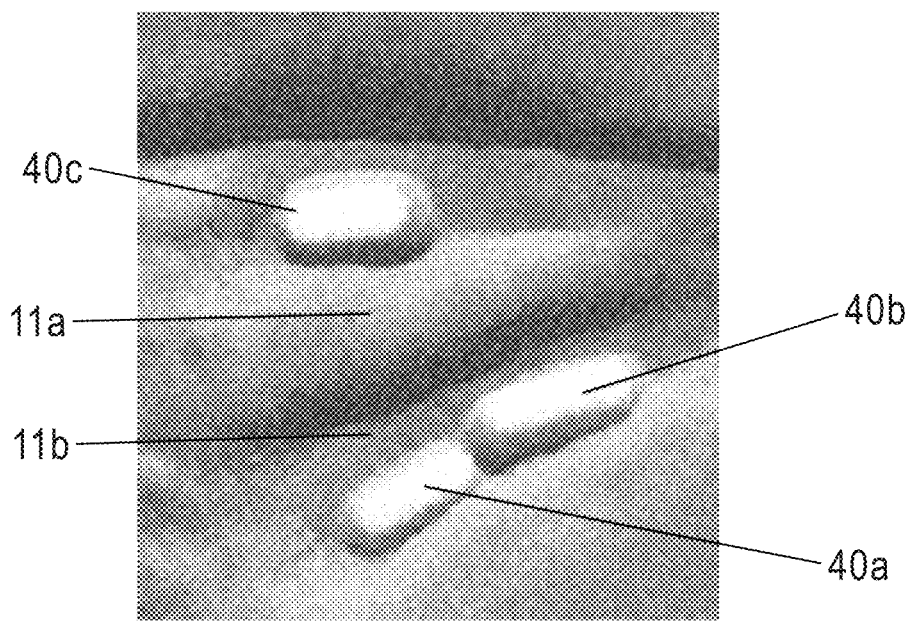
FIG. 10 illustrates an AFM topographic scan of the transfer layer after the assembly step according to an embodiment of the present invention.

The assembly was then heated to 150° C. on hot plate, thereby inducing an unzip reaction in the phthalaldehyde polymer. The molecular fragments easily evaporate from the surface and the nano-rods are thus transferred on to the $SiO_2$ surface of the target wafer, preserving their exact position and orientation, as shown in FIGS. 9 and 10. FIG. 9 represents a negative of a SEM micrograph of the nano-rod assembly after transfer to the $SiO_2$ surface of the target wafer. FIG. 10 shows an AFM topographic scan of the transfer layer after the assembly step (rendered in dark grey) superimposed with an SEM image (rendered white) taken of the same surface area after transfer of the rods on to the target surface. Contrasts are exaggerated.

At present, more shall be said about the transfer layer and specifically the types of materials (e.g., polymers) that can be used therein. As evoked earlier, the polymer chains are able to unzip upon suitable stimulation, e.g. via an energetic or a chemical modification event. Such an event can for instance result in breaking a single chemical bond of the chain, which in turn triggers the unzipping reaction. This contrasts with polymers (e.g. polystyrene, poly-α-styrene) which can unzip if the polymer chain has enough thermal energy to decompose. Here, one broken bond suffices to trigger the unzipping effect. As the latter is self-sustained, less energy needs to be provided for the polymer to unzip during the patterning process.

Figure 11:
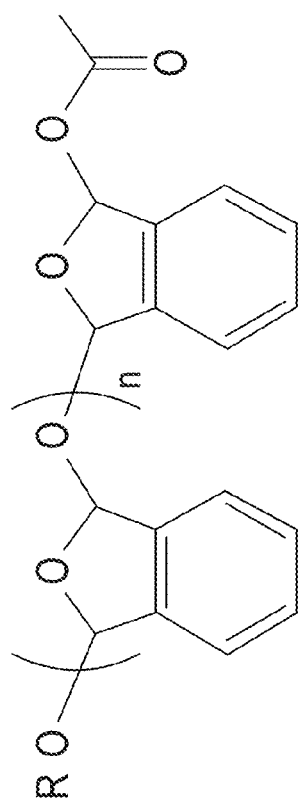
FIG. 11 illustrates the chemical structure of a poly(phthalaldehyde) polymer as used in embodiments.

Briefly, a polymer suitable to implement the above principle is a poly(phthalaldehyde), whose chemical structure is depicted in FIG. 11. The example described in reference to FIGS. 7-10 has for instance been successfully implemented with a poly(phthalaldehyde) having a molecular weight of approximately 36 kDa, corresponding to ~270 monomer units per molecule. The monomer units are highly volatile because of their low molecular weight (e.g. 134 Da).

As disclosed, heating the polymer suffices to provide the film with an energy adapted to activate the desired unzipping effect. In variants, a chemical trigger event can be relied upon. For example, use can be made of a reactant in proximity to the polymer chains. The chain of causation is thus the following: a chemical reaction occurs; the chemical reaction triggers a chemical modification event (e.g. a degradation event) in a polymer chain; and said event triggers the unzipping reaction. However, the principle remains the same as before: the polymer film 20 is stimulated such that an unzipping reaction is triggered, leading the polymer to decompose into volatile units.

For example, the reactant is an acid-generator. Preferably, the polymer film is provided with the acid-generator included therein (e.g. immersed). The acid-generator can for instance be a thermal-acid-generator (TAG). In variants, the acid-generator is a photo-acid-generator (PAG). In each of the above case, the film includes polymers which are unstable under the operating conditions. Activating the acids leads to a chemical scission of the polymer chains and triggers the unzip reaction. Therefore other stimuli than heat, i.e. light or electrons, can be used to create the patterns in the polymer film. Thus, the polymer used is advantageously chosen amongst a class of polymers which unzip upon breaking one chemical bond thereof.

The polymer whose chemical structure is depicted in FIG. 11 is one such polymer. As disclosed, the polymer includes approximately n=270 monomer units equivalent to a molecular weight of 36 kDa.

A preferred strategy is to use a polymer medium that fully volatilizes on heating. Here a polymeric material is presented that has a low ceiling temperature and where one degradation event is amplified via an unzipping of the entire chain. It was for instance shown that polyaldehydes are such a class of materials with a tunable degradation temperature. Despite many reports on the polymerization of aliphatic aldehydes, only few have been focused on aromatic aldehyde, e.g. benzyladehydes, since these monomers show a very limited reactivity towards nucleophiles. However, the polymerization of phthalaldehyde monomer has been accomplished using y-ray irradiation, anionic, cationic and coordinative polymerization processes. None of the above synthetic techniques provides predictable molecular weight, narrow polydispersities or end-group fidelity.

Figure 12:
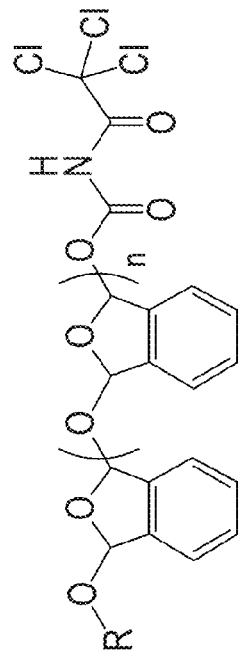
FIG. 12 illustrates a possible reaction scheme for the polymerization of phthalaldehyde monomers.
Figure 12:
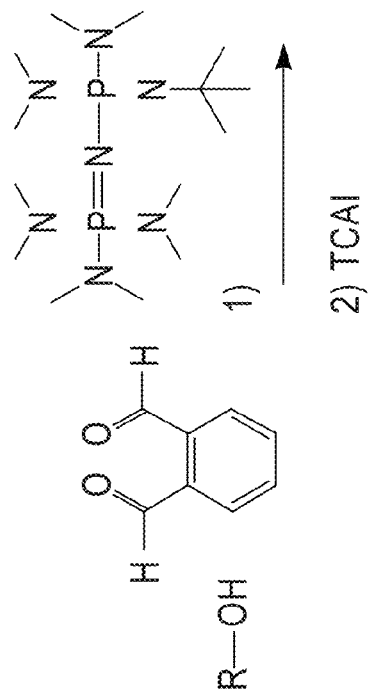

Thus, efforts have focused on an organocatalytic approach to the polymerization of phthalaldehyde using dimeric 1-tert-butyl-2,2,4,4,4-pentakis(dimethylamino)-$2^{\wedge 5},4^{\wedge 5}$-catenadi (phosphazene) ($P_2$-t-Bu) phosphazene base as an anionic catalysts in presence of an alcoholic initiator (as shown in FIG. 12, illustrating anionic cyclopolymerization of phthalaldehyde).

The polymerization of phthalaldehyde can for instance be carried out in Tetrahydrofuran (THF), −78° C., for 1 hour using benzyl alcohol or 1-pyrene butanol as initiators for two different monomer concentrations and different monomer to initiator to catalyst ratios (see Table 1).

The synthesis is terminated by quenching the polymer chains. In the present embodiment, polymerizations were quenched with trichloroacetyl isocyanate (TCAI), which reacts rapidly and quantitatively with hydroxyl chain ends, whereby polymer chains are end-group capped. All the more, this prevents depolymerization as the reaction returns to room temperature.

TABLE 1

Molecular characterizations of polyphthalaldehydes obtained after 1 hour in THF at −78° C. using alcohol (I) as initiator and $P_2$—t-Bu ($P_2$) as catalyst.

| Entry | $[M]_0/[I]_0/[P_2]_0$ | $[M]_0$ (mol/L) | Conv. (%)[b] | $Mn^c$ (g/mol) | PDI[c] |
|---|---|---|---|---|---|
| 1 | 200/1/1 | 0.7 | 73 | 10180 | 1.83 |
| 2 | 200/1/1 | 0.15 | 64 | 12070 | 1.67 |
| 3 | 200/1/0.5 | 0.7 | 90 | 36080 | 1.14 |
| 4 | 400/1/0.5 | 0.7 | 92 | 44400 | 1.12 |
| 5[a] | 600/1/0.5 | 0.7 | 93 | 153640 | 1.25 |

[a]Initiator = 1-pyrenebutanol,
[b]Determined by $^1$H NMR spectroscopy,
[c]Molecular weight and polydispersity index (PDI) as determined by gel permeation chromatography (GPC).

Lower catalyst and solution concentrations provided narrowly dispersed products, high conversions and predictable molecular weights. A comparison between the polyphthalaldehyde measured molecular weights ($M_n$GPC) and those calculated ($M_n$th=134.13*($[M]_0/[I]_0$*Conv(%))) (not depicted) further shows a linear fit to molecular weights up to 45,000 g·mol$^{-1}$, consistent with a living polymerization.

In other variants, one can use poly(alpha-methylstyrene) instead of poly(phthalaldehyde). However, the latter is not as advantageous as poly(phthalaldehyde) in many respects (temperature, speed, effectiveness and contamination of both the probe tip and the media). Other polymers can be contemplated, be it amongst the polyaldehydes.

It is noted that the present invention extends to products including a substrate and nano-objects deposited with respect to surface patterns on one face of the substrate, as obtainable by present methods. Such products are characterized by a more precise positioning of nanoparticles, which is advantageous for many applications such as mentioned below. They shall further reflect other features of the method used to obtain them, e.g., surface patterns, residues from the functionalized areas and/or transfer layer, and the like.

While the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiment disclosed, but that the present invention will include all embodiments falling within the scope of the appended claims. In particular, the present invention can be contemplated for various applications. For example, it can be directed to products embodying a Physical Unclonable Function (also called Physically Unclonable Function or PUF for short), i.e., a function embodied in a physical structure, which is easy to evaluate but hard to fully characterize. A method for manufacturing such a product is to use a transfer layer having a surface with "deterministic" asperities (functionalized areas), i.e., causally determined by preceding events or natural laws. Then, nano-objects randomly deposit on and get trapped at asperities of the surface, such as to obtain a patterned material surface, which forms the PUF. As it can be realized, the resulting PUF is made easier to read out owing to the (partial) knowledge one has of the surface, that is, the deterministic aspects thereof. For example, the general pattern and the location of the particles can be known in advance and only the filling level (e.g., of a given type) of particles is random.

Other applications can be contemplated. For example, as known, metal nanoparticles interact with light in the form of plasmon-polaritons. This interaction locally enhances the electric (and magnetic) field of the light and can therefore be used in several applications from sensing single molecules by raman spectroscopy (surface enhanced raman spectroscopy or SERS), improving the efficiency of photovoltaic devices or creating nano-antennas for the guidance of light. For all these applications a directed placement of the nanoparticles provides improved performance with respect to random assemblies. In SERS, the gap between two nanoparticles is decisive for the field enhancement and a placement of sensors in a pixel grid adjusted to the resolution of the camera enables parallel readout of a field of sensors. In photovoltaic devices the concentration of light enhancing units can be controlled and optimized by directed assembly and for the creation of nanoantennas the direction and the placement have to be controlled accurately.

The assembly is not restricted to metal particles. In particular semiconducting particles are interesting too. The particles themselves then constitute quantum dots, which have well defined electronic energy levels, and can act as artificial atoms. It has been demonstrated that a single particle can act as a laser, positioning of several particles in straight line with defined distance can define the cavity of such a laser and therefore define the direction of light emission. Similarly a quantum dot placed precisely in a gap of electrodes acts as a single electron transistor.

We claim:

1. A semiconductor device comprising:
    a substrate; and
    at least one nano-object located on said substrate, said at least one nano-object having an average main dimension between 10 nm and 100 nm,
    wherein at least a substantial portion of the at least one nano-object is a nano-rod,
    wherein the substrate is a Si wafer covered with an amorphous carbon layer which is covered with a layer of $SiO_2$, and
    wherein a bottommost surface of at least one nano-object directly contacts a surface of the layer of $SiO_2$ which is above said amorphous carbon layer.

2. The semiconductor device of claim 1, wherein said substrate includes at least one surface pattern on one surface thereof.

3. The semiconductor device of claim 1, wherein said at least one surface pattern is a void.

4. The semiconductor device of claim 1, wherein said at least one surface pattern is a doped contact pad.

5. The semiconductor device of claim 1, wherein said at least one surface pattern is on chip wiring.

6. The semiconductor device of claim 1, wherein said at least one surface pattern is an alignment mark.

7. The semiconductor device of claim 1, wherein said nano-rod has a diameter of 25±5 nm and a length of 75±10 nm.

8. The semiconductor device of claim 1, wherein said average main dimension is between 25 nm and 75 nm.

9. A semiconductor device comprising:
    a Si wafer;
    an amorphous carbon layer located on a surface of the Si wafer;
    a layer of $SiO_2$ located on a surface of said amorphous carbon layer; and
    at least one nano-rod located directly on and in physical contact with a surface of said layer of $SiO_2$.

10. The semiconductor device of claim 9, wherein said at least one nano-rod has an average main dimension between 10 nm and 100 nm.

11. The semiconductor device of claim 9, wherein said at least one nano-rod has a diameter of 25±5 nm and a length of 75±10 nm.

12. The semiconductor device of claim 9, wherein said average main dimension is between 25 nm and 75 nm.

13. The semiconductor device of claim 9, wherein said surface of said layer of $SiO_2$ is an uppermost surface of said layer of $SiO_2$.

* * * * *